(12) United States Patent
Arai et al.

(10) Patent No.: US 6,190,457 B1
(45) Date of Patent: Feb. 20, 2001

(54) CVD SYSTEM AND CVD PROCESS

(75) Inventors: Takayuki Arai; Junichi Hidaka; Koh Matsumoto; Nakao Akutsu; Kazuhiro Aoyama; Yoshiaki Inaishi; Ichitaro Waki, all of Tsukuba (JP)

(73) Assignee: Nippon Sanso Corporation, Tokyo (JP)

(*) Notice: Under 35 U.S.C. 154(b), the term of this patent shall be extended for 0 days.

(21) Appl. No.: 08/952,517

(22) PCT Filed: Mar. 18, 1997

(86) PCT No.: PCT/JP97/00867
§ 371 Date: Nov. 21, 1997
§ 102(e) Date: Nov. 21, 1997

(87) PCT Pub. No.: WO97/36320
PCT Pub. Date: Oct. 2, 1997

(30) Foreign Application Priority Data

Mar. 22, 1996 (JP) ................................................ 8-66396
Feb. 7, 1997 (JP) ................................................ 9-25505

(51) Int. Cl.[7] .................................................. C23C 16/00
(52) U.S. Cl. .................. 118/715; 118/725; 427/148.1; 427/255.23; 427/225.28
(58) Field of Search .................................. 118/715, 725; 427/255.23, 255.28, 255.34, 248.1

(56) References Cited

U.S. PATENT DOCUMENTS 5,356,657 * 10/1994 Terada et al. ......................... 427/66
5,370,738 * 12/1994 Watanabe et al. ..................... 118/725

FOREIGN PATENT DOCUMENTS

| 3-66121 | 3/1991 | (JP) . |
| 6-163415 | 6/1994 | (JP) . |
| 7-27868 | 3/1995 | (JP) . |
| 7-78773 | 3/1995 | (JP) . |
| 8-288224 | 11/1996 | (JP) . |

* cited by examiner

*Primary Examiner*—Jeffrie R. Lund
(74) *Attorney, Agent, or Firm*—Armstrong, Westerman, Hattori, McLeland & Naughton

(57) ABSTRACT

Provided are a CVD system and a CVD process which can grow excellent compound semiconductor thin films of two or more components having least defects and which enjoy high source gas utilization efficiency and increased productivity. According to the CVD system and the CVD process, at least two kinds of source gases are introduced parallel to the surface of a substrate 11 placed in a reactor 10 to grow a compound semiconductor thin film of two or more components on the surface of the substrate 11. The CVD system contains two separators 18, 19 disposed in the reactor 10 on the upstream side of the substrate mounting section to be parallel to the surface of the substrate 11 so as to define in the reactor three parallel layers of passages consisting of a first passage 20, a second passage 21 and a third passage 22; a first CVD gas introducing pipe 23 communicating to the first passage 20; a second CVD gas introducing pipe 24 communicating to the second passage 21; and a deposition accelerating gas introducing pipe 25 communicating to the third passage 22.

9 Claims, 4 Drawing Sheets

CVD SYSTEM AND CVD PROCESS

TECHNICAL FIELD

This invention relates to a chemical vapor deposition (CVD) system and a CVD process, more particularly to a horizontal CVD system and a CVD process in which CVD gases are allowed to flow parallel to the surface of a heated substrate to obtain a substrate having on the surface thereof a two-or-more-component compound semiconductor thin film.

BACKGROUND ART

A system, for example, described in Japanese Patent Publication No. Hei 7-27868 is known as a horizontal CVD system for the growth of a compound semiconductor thin film on the surface of a substrate placed in a reactor by introducing a source gas thereto.

The CVD system described in the above official gazette has a cylindrical reactor oriented such that the axis thereof may be horizontal and a susceptor (mount) for retaining a substrate, disposed on the bottom of the reactor. A separator is disposed in the reactor on the upstream side of the substrate mounting section to be parallel to the substrate surface so as to define two parallel passages above and below the separator, i.e. a lower passage on the substrate mounting section side and an upper passage on the counter substrate mounting section side. The reactor has an exhaust pipe on the downstream side of the substrate mounting section. A flow channel for smoothing the gas flow is provided on the upstream side of the susceptor in the reactor, and a heating RF coil is disposed to surround the reactor at the substrate mounting section.

In the CVD system described above, a CVD gas formed by diluting a source gas with a diluent gas is introduced to the upper passage in the state where the substrate is mounted on the susceptor and is heated by the RF coil, and a carrier gas containing no source gas is introduced to the lower passage to grow a deposition film. The carrier gas may be the same diluent gas as contained in the CVD gas or such gas containing a small amount of volatilization preventive gas.

The CVD gas and the carrier gas supplied to the upper passage and the lower passage respectively flow through the distal end of the separator toward the substrate, and the source gas contained in the CVD gas diffuses into the carrier gas under the mutual diffusion actions of the gases and approaches the surface of the substrate with the concentration thereof in the carrier gas being increased gradually. Then, the source gas diffused into the carrier gas undergoes pyrolysis at a high-temperature section around the substrate and deposited on the substrate surface to grow a deposition film thereon.

In this process, the amount of source gas to be diffused from the CVD gas into the carrier gas and the amount of source gas to be consumed from the carrier gas by deposition onto the substrate surface can be balanced per unit time by suitably adjusting the flow velocity of the carrier gas and that of the CVD gas and the concentration of the source gas in the CVD gas, and thus the source gas concentration of the carrier gas flowing over the substrate surface can be allowed to be of uniform distribution in the flow direction, growing a deposition film having a uniform thickness.

As described above, the horizontal CVD system can give a substrate on which a film having a uniform film thickness is formed by introducing a CVD gas and a carrier gas separately in two-layer flows by employing the separator to allow the source gas in the CVD gas to diffuse into the carrier gas and to be carried onto the substrate surface, and also the system can reduce the amount of detrimental deposition on others than the substrate, since the concentration of the source gas flowing over the substrate surface is reduced by the presence of the carrier gas.

However, when a deposition film of two or more components is formed employing such horizontal CVD system, those elements having high volatility among other component elements evaporate from the deposition film, so that the resulting deposition film can contain defects. In order to prevent such defects from occurring, a countermeasure has been conventionally taken, for example, to supply a source gas containing a highly volatile element (volatile gas) in an amount corresponding to or higher than the equilibrium partial pressure of the volatile gas, but it resulted in increased cost due to reduction in feedstock utilization efficiency.

Meanwhile, it is necessary to adjust the gas flow velocity to an optimum condition in order to allow a desired reaction product to be deposited on the substrate surface. However, the control of gas flow velocity requires delicate adjustments in terms of feedstock utilization efficiency, impurity doping essential for producing devices, etc. Thus, it has been difficult in the conventional horizontal CVD system to form thin films for devices having complicated structures satisfying all the requirements for film thickness, composition and doping uniformity.

More specifically, it has been conventionally carried out to adjust the source gas concentration so as to prevent the volatile component from volatilizing or to adjust the gas flow velocity so as to allow the zone on which the reaction product is to be deposited to coincide with the substrate surface. However, the conditions for obtaining a uniform film thickness and the optimum conditions for the source gas concentration do not necessarily agree with the conditions for obtaining excellent film properties. Further, since the optimum gas flow velocity conditions for obtaining film thickness uniformity do not necessarily agree with those for obtaining doping uniformity, the method of adjusting gas flow velocity is not suitable for depositing a thin film having a complicated multilayer structure for devices etc.

Furthermore, in the conventional system, since decomposition products and the like are deposited around the substrate, the reactor must be cleaned frequently.

Further, the CVD system having the conventional separator described above forms thin films having defects due to particles and lowers deposition speed, uniformity of the thin films and reproductivity depending on operating conditions, for example, deposition temperature, the kind of source gas, conditions of gas flow velocity, etc. These problems have arisen frequently particularly when there is a great difference between the flow velocities of the gases in the respective layers defined by the separator.

Under such circumstances, the present inventors made extensive studies to find that turbulence of gas flow occurring in the vicinity of the distal end portion of the separator can be causative of these problems. More specifically, in this CVD system, since no consideration is given to turbulence of gas flow occurring in the vicinity of the distal end portion of the separator, eddy currents can occur in the gas flow at the distal end portion of the separator depending on the balance between the gas flow velocities in the respective layers defined by the separator. If an eddy current occurs at the distal end portion of the separator, a feedstock involved in the eddy current circulates along it to dwell there for a long time, and the temperature of the gas is increased by radiation from a heated substrate to cause pyrolysis of the gas and formation of particles. Thus, the particles formed on the upstream side of the substrate if brought onto the substrate can be causative of crystal defects to lower quality of the resulting film. Further, the particles serve as growth nuclei in the vapor phase to consume feedstocks present around them, leading to reduction in feedstock utilization efficiency. Further, when the source gases supplied to the respective layers are highly reactive with each other, the occurrence of eddy currents promotes synthesis of a reaction product by means of vapor phase reaction to cause deterioration of film quality and lowering in feedstock utilization efficiency.

As described above, in the CVD system having the conventional separator, the gas flow velocity in each layer defined by the separator is limited to a very small range, so that it is sometimes difficult to set gas flow velocity conditions most suitable for thin film deposition.

A first objective of the present invention is to provide a CVD system and a CVD process which can form an excellent compound semiconductor multilayer thin film of two or more components having reduced defects and which enjoy high source gas utilization efficiency and increased productivity.

A second objective of the present invention is to provide a CVD system which can secure a wide setting range of gas flow velocity in each layer defined by the separators and which can grow a compound semiconductor thin film of two or more components, having excellent quality and excellent uniformity with high reproductivity without being affected by the gas flow velocity in each layer and without reducing the feedstock utilization efficiency.

DISCLOSURE OF THE INVENTION

The CVD system according to the present invention for growing a compound semiconductor thin film of two or more components on the surface of a substrate placed in a reactor by introducing at least two kinds of source gases parallel to the substrate surface contains two separators disposed on the upstream side of the substrate mounting section to be parallel to the substrate surface so as to divide the inside of the reactor into three parallel layers of passages consisting of a first passage, a second passage and a third passage from the substrate mounting side, and a first CVD gas introducing pipe, a second CVD gas introducing pipe and a deposition accelerating gas introducing pipe which are connected to the first passage, the second passage and the third passage respectively.

The reactor has, at a portion opposing the substrate mounting section, a deposition promoting bed protruding toward that section. A first CVD gas growed by diluting a volatile source gas with a diluent gas and a second CVD gas growed by diluting a hardly volatile source gas with a diluent gas are introduced to the first CVD gas introducing pipe and the second CVD gas introducing pipe respectively. A gas containing no source gas and having a diffusion coefficient with respect to the source gases smaller than those of the diluent gases is introduced to the deposition accelerating gas introducing pipe.

In the CVD process according to the present invention for growing a compound semiconductor thin film of two or more components on the surface of a substrate by introducing at least two kinds of source gases parallel to the surface of the substrate and effecting a heat reaction of the source gases on the substrate surface to deposit the resulting reaction product thereon, a first CVD gas formed by diluting a volatile source gas with a diluent gas, a second CVD gas formed by diluting a hardly volatile source gas with a diluent gas and a deposition accelerating gas containing no source gas are introduced respectively to a first passage on the substrate side, a second passage next to it and a third passage farthest from the substrate which are defined on the upstream side of the substrate in the form of three layers parallel to the substrate surface.

A gas having a diffusion coefficient with respect to the source gases smaller than those of the diluent gases is employed as the deposition accelerating gas. The ratio of flow rate of the diluent gas in the first CVD gas to that of the diluent gas in the second CVD gas is adjusted without changing the total flow rate of the diluent gases.

According to the CVD system and CVD process of the present invention, a compound semiconductor thin film of two or more components can be produced efficiently, and also optimization of thin films for devices having complicated multilayer structures become facile. Further, since detrimental deposition can be reduced, the frequency of cleaning the reactor can be reduced, improving productivity.

Furthermore, thin films having excellent quality and excellent uniformity can be produced efficiently by reducing the thickness of the distal end portion of each separator continuously or stepwise. Such separators can be employed most suitably in a CVD system for growing a compound semiconductor thin film of two or more components on the surface of a substrate placed in a reactor by introducing at least two kinds of source gases thereto parallel to the substrate surface.

The compound semiconductor thin film of two or more components according to the present invention means, for example, that of a Group III-V compound or of a Group II–VI compound, for example, two-component films such as of GaAs (gallium arsenic) and GaN (gallium nitride), three-component films such as of GaInAs to be formed by partly replacing Ga with In (indium) or AlGaN to be formed by partly replacing Ga with Al (aluminum) or a multi-component films further containing P (phosphorus) and the like.

The CVD gases are prepared by diluting source gases respectively with inert gases serving as the diluent gases including, for example, hydrogen, helium, argon and nitrogen. The source gases are of components which contribute to the CVD reaction and include, for example, one or a mixture of ammonia, silane, arsine, phosphine, trimethyl gallium (TMG) and trimethyl indium vapors. For example, when such GaAs film is to be grown on a GaAs substrate, TMG vapor and arsine are employed as the source gas of gallium and as the source gas of As respectively, and CVD gases prepared by diluting such source gases with hydrogen are employed.

The source gases can be grouped into the volatile source gas which can easily be volatilized by heat and the hardly volatile source gas which can hardly be volatilized by heat. Referring to arsine and the TMG vapor described above, the former belongs to the volatile source gas, and the latter belongs to the hardly volatile source gas.

Meanwhile, the deposition accelerating gas is an inert gas which does not contribute to the CVD reaction, and for example, hydrogen, helium, argon or nitrogen can be employed. While the deposition accelerating gas employable may be the same as the diluent gas, it is preferred to employ a gas having a diffusion coefficient with respect to the source gases smaller than those of the diluent gases or to supply the deposition accelerating gas in a state where it can hardly be diffused under control of the flow rate and the like, and it is also possible to employ as necessary a mixture of two or more inert gases selected from hydrogen, argon, nitrogen, etc.

BEST MODE FOR CARRYING OUT THE INVENTION

Figure 1:
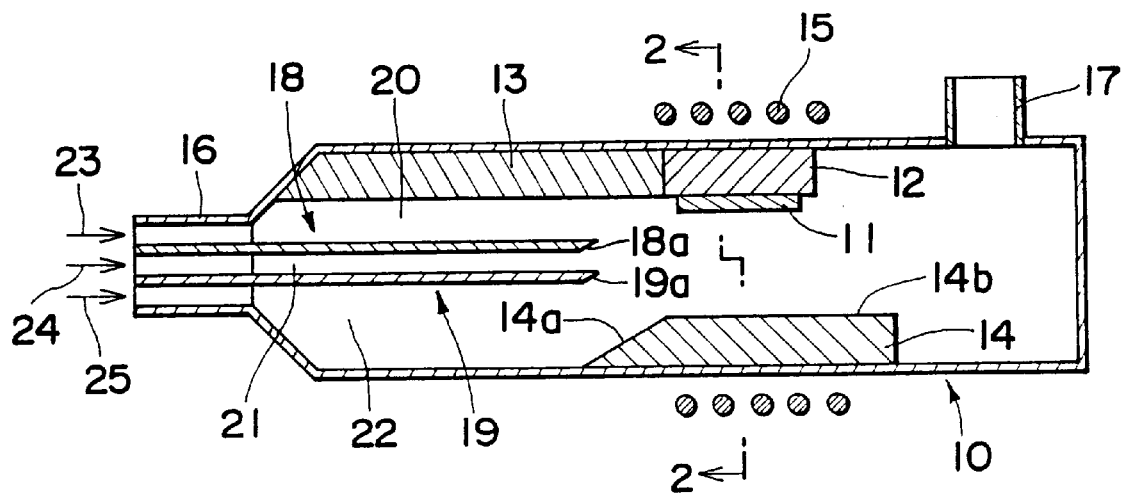
FIG. 1 is a cross-sectional view showing a CVD system according to one embodiment of the present invention.

The present invention will be described below more specifically referring to the drawings.

Figure 2:
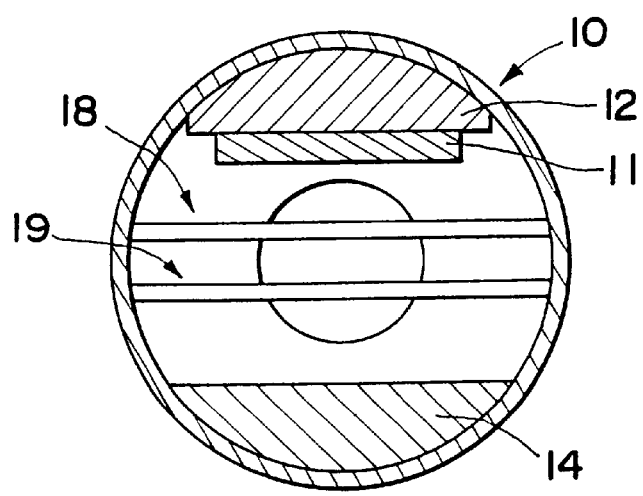
FIG. 2 is a cross-sectional view taken along the line 2—2 in FIG. 1.

FIGS. 1 and 2 show an example of the CVD system according the present invention.

The reference number 10 denotes a cylindrical reactor which is oriented such that the axis thereof may be horizontal. The reactor 10 contains a susceptor 12 for retaining a substrate 11 thereon and a flow channel 13 on the upstream side of the susceptor 12, both of which are provided on the inner upper side of the reactor 10. A deposition promoting bed 14 protruding toward the substrate 11 mounting section is provided at the inner lower side of the reactor 10 to be opposed to the substrate mounting section. An RF coil 15 for heating the substrate 11 via the susceptor 12 is disposed to surround the reactor 10.

The reactor 10 is provided with a gas introducing section 16 at the upstream extremity and an exhaust pipe 17 at the downstream extremity. The reactor 10 contains two separators 18, 19 which are extended from the gas introducing section 16 to the front end positions of the susceptor 12 and deposition promoting bed 14.

The separators 18, 19 are of thin plates disposed parallel to the surface of the substrate 11 to divide the zone from the gas introducing section 16 to the vicinity of the susceptor 12 and deposition promoting bed 14 into a first passage 20 on the susceptor side, an intermediate second passage 21 and a third passage 22 on the deposition promoting bed side, thus defining passages in the form of three layers parallel to one another within the reactor 10. The distal end portions 18a, 19a of the separators 18, 19 are tapered such that the thickness thereof may be reduced continuously.

Referring to these passages, a first CVD gas introducing pipe 23, a second CVD gas introducing pipe 24 and a deposition accelerating gas introducing pipe 25 are connected to the first passage 20, the second passage 21 and the third passage 22, respectively, at the inlet of the gas introducing section 16, and a first CVD gas, a second CVD gas and a deposition accelerating gas are introduced to the first passage 20, the second passage 21 and the third passage 22, respectively.

Meanwhile, the deposition promoting bed 14 is provided so as to reduce the cross-sectional area of the gas passage in the reactor 10 at the portion where the substrate 11 is present. The bed 14 has on the upstream side a slant face 14a sloping up gradually toward the downstream side. The face 14b of the bed 14 opposing the substrate 11 is formed to be parallel to the surface of the substrate 11.

When a compound semiconductor thin film of two or more components is to be grown in the CVD system having such structure, the first CVD gas, the second CVD gas and the deposition accelerating gas are first introduced to the first passage 20, the second passage 21 and the third passage 22 respectively in the state where the substrate 11 retained by the susceptor 12 is heated by the RF coil 15 to a predetermined temperature.

The first CVD gas, the second CVD gas and the deposition accelerating gas introduced into the reactor 10 flow through the corresponding passages separately and independently, and after passing by the distal ends of the separators 18 and 19, they flow toward the substrate 11 while the raw material gases contained in the first and second CVD gases diffuse into each another.

In this process, a volatile source gas is employed as the source gas to be contained in the first CVD gas flowing through the first passage 20 closest to the surface of the substrate 11, while a hardly volatile source gas is employed as the source gas to be contained in the second CVD gas flowing through the second passage 21. Thus, the concentration of the volatile source gas in the gas present around the substrate 11 can be increased to achieve efficiently decomposition of the source gases and deposition of the resulting decomposition product onto the surface of the substrate 11. Accordingly, source gas utilization efficiency can be increased on a great margin, and also the volatile elements can be prevented from volatilizing from the deposition film, giving deposition films with reduced % defective. Further, compared with the case where a volatile source gas is introduced throughout the reactor, the concentration of the volatile source gas around the substrate 11 can be maintained at the comparable level or higher employing a smaller amount of volatile source gas, so that the amount of source gas to be used can be reduced on a great margin.

The hardly volatile source gas contained in the second CVD gas flowing through the second passage 21 approaches the surface of the substrate 11 while it gradually diffuses into the first CVD gas. The hardly volatile source gas in the second CVD gas further continues to diffuse into the first CVD gas under the mutual diffusion actions when it passes by the surface of the substrate 11, and the hardly volatile source gas diffused into the first CVD gas is reacted to form a reaction product which is deposited successively on the surface of the substrate 11.

By balancing the amount of the hardly volatile source gas to be diffused into the first CVD gas with the amount of that source gas to be consumed in the form of reaction product from the first CVD gas, the source gases are allowed to pass by the surface of the substrate 11 in a uniform concentration distribution in the direction of gas flow, and thus an excellent substrate on which a film having a uniform thickness is formed can be obtained. Further, the site where the reaction product is to be deposited can be controlled and detrimental deposition on others than the substrate 11 can be reduced on a great margin, since the distance of the zone (diffusing and mixing zone) where the hardly volatile source gas is diffused gradually into the first CVD gas to be blended fully therewith can be adjusted so as to achieve decomposition of the hardly volatile source gas and deposition of the resulting decomposition product.

Figure 3:
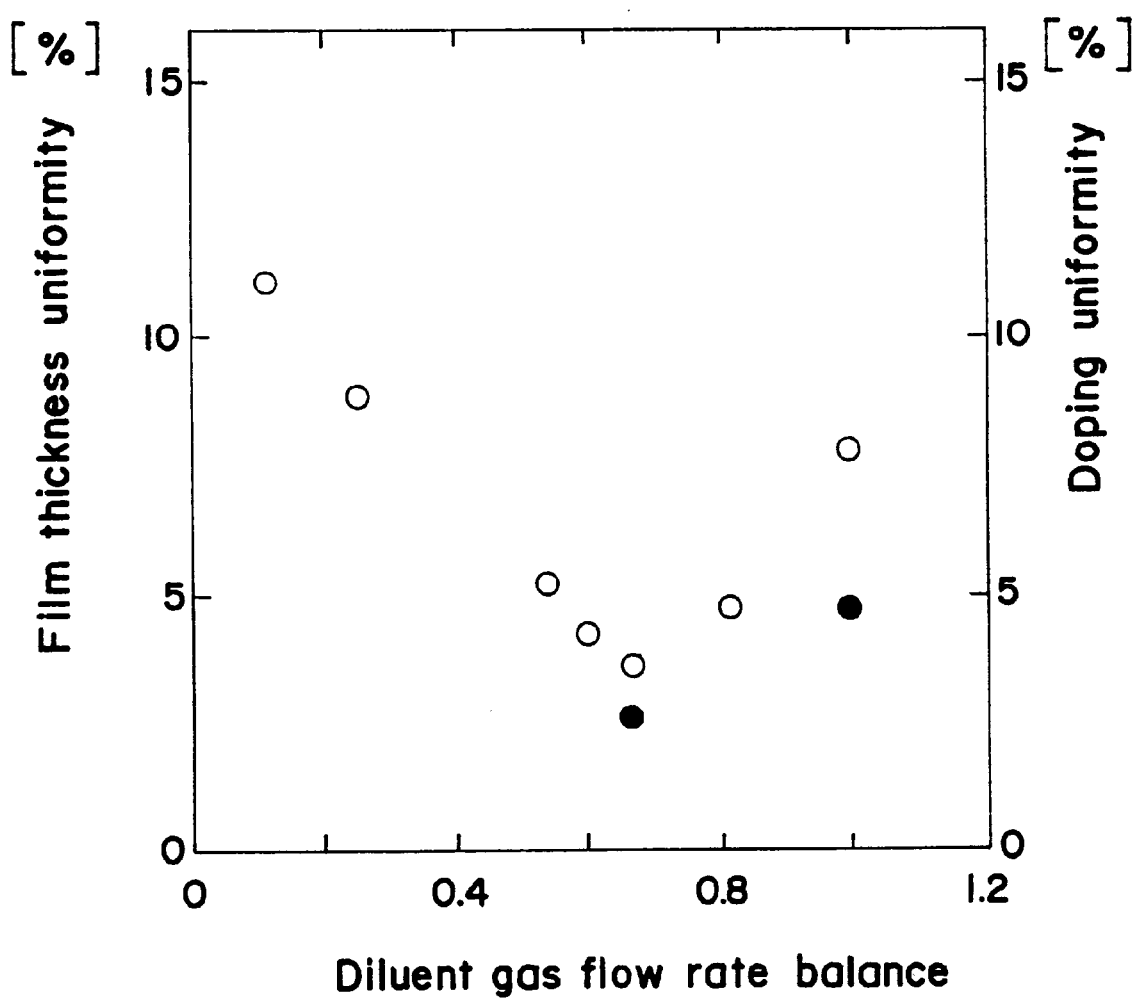
FIG. 3 is a graph showing flow rate balance between the diluent gases vs. film thickness uniformity and doping uniformity taken on the vertical axis.

The adjustment of this diffusing and mixing zone of the hardly volatile source gas can be carried out by adjusting the balance between the flow rate of the diluent gas contained in the first CVD gas and that of the diluent gas contained in the second CVD gas. For example, as shown clearly in FIG. 3 illustrating results of experiments to be described later, when the total amount of the diluent gases to be supplied to the reactor 10 is fixed and the flow rate of the diluent gas contained in the first CVD gas is changed relative to the flow rate of the diluent gas contained in the second CVD gas, the film thickness uniformity (indicated by the open circles in the Figure) and doping uniformity (indicated by closed circles in the Figure) are changed. In other words, it can be understood that the film thickness uniformity is reduced in this case, if the flow rate balance of the diluent gases is smaller or greater than a certain range, and that there is an optimum flow rate balance.

When the flow rate balance is to be adjusted, it is also possible to fix the flow rate of one diluent gas and to change the flow rate of the other diluent gas. However, in this case, intricate adjustment procedures are required, since the flow rate (flow velocity) of the entire gas passing the portion in the reactor where the substrate is present is changed. Accordingly, it is preferred to adjust the flow rate ratio of the two diluent gases without changing the total gas flow rate in the reactor. For example, when the total flow rate of the diluent gases is 20, the ratio of the flow rate (A) of the diluent gas in the first CVD gas to the flow rate (B) of the diluent gas in the second CVD gas may be changed to A:B=9:11 (flow rate balance=0.82), =10:10 (equivalent) or =11:9.

It should be noted here that the optimum flow rate balance can be suitably set depending on the cross-sectional area of each passage which influences the concentration or flow velocity of the hardly volatile source gas in the second CVD gas, the distance between the distal end of each separator and the substrate, the size of the reactor, the total amount of the gases, etc.

Further, even when the optimum gas flow velocity conditions for obtaining uniformity in the film grown on the substrate surface and doping uniformity are different, reaction products can be deposited uniformly on the substrate surfaces at certain optimum gas flow velocities, respectively, by adjusting the flow rate balance of the diluent gases, facilitating optimization of thin films for devices having complicated multilayered structures.

Meanwhile, a gas having a diffusion coefficient with respect to the source gases smaller than those of the diluent gases employed in both CVD gases can be used as the deposition accelerating gas to be introduced to the third passage 22 so as to prevent the source gases contained in the CVD gases from diffusing into the deposition accelerating gas to lower the concentrations of the source gases in the CVD gases, and thus the amounts of source gases to be exhausted together with the deposition accelerating gas can be reduced, leading to great increase in feedstock utilization efficiency.

Further, in the case where the hardly volatile source gas in the second passage 21 diffuses into the deposition accelerating gas in the third passage 22, the diffusion coefficient of the deposition accelerating gas can be controlled by employing a mixed gas as the deposition accelerating gas or by adjusting the flow rate thereof. Thus, diffusion of the source gases into the deposition accelerating gas can be reduced to be able to control the zone where the hardly volatile source gas is to be deposited.

Further, since the gas flowing through the reactor 10 can be urged toward the surface of the substrate 11 and also the gas flow velocity at such portion can be increased by providing the deposition promoting bed 14 in the reactor 10 and thus reducing the cross-sectional area of the gas passage around the surface of the substrate 11, the thickness of the velocity boundary layer in the gas flowing over the surface of the substrate 11 and that of the temperature boundary layer having a great temperature gradient near the substrate 11 can be reduced, to be capable of control for providing optimum conditions for achieving efficiently decomposition and deposition of the volatile source gas which was supposed to be difficult to decompose. Further, effective feedstock concentration around the substrate 11 can be increased, so that a film can be grown efficiently in an excellent state.

Incidentally, the deposition promoting bed 14 may be omitted, and instead the reactor 10 itself may be allowed to have a configuration as if it has the bed 14. In this embodiment, while the system is of the structure where the substrate 11 is retained at the upper part of the reactor 10 with the surface on which a film is to be formed facing downward, the substrate may be designed to be retained at the lower part of the reactor like in the conventional systems.

Figure 4:
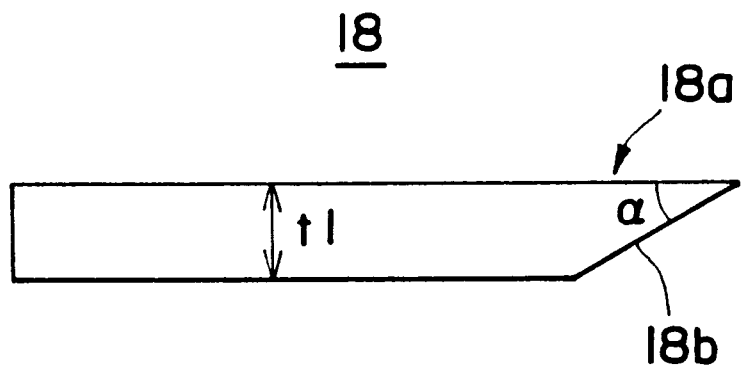
FIG. 4 is a side view showing a first example of the distal end portion of the separator.

As shown in FIG. 4, the separator is formed such that the thickness thereof may be reduced continuously at the distal end portion. It should be noted that the separators 18, 19 are of the same configuration, so that only the separator 18 will be described.

The distal end portion 18a of the separator 18 may be allowed to have a desired configuration depending on the thickness t1 of the separator itself. While it is preferred that the distal end portion 18a has a smallest possible taper angle α taking the ranges of gas flow velocity in the upper and lower layers, rigidity, processability, etc. into consideration. However, if the taper angle α is too small, a long tapered face 18b is formed to bring rise to problems in terms of rigidity and processability; whereas if the taper angle α is great, the effect to be brought about by continuously reducing the thickness of the distal end portion 18a becomes small. Preferred taper angle α in an ordinary use range is 5 to 30 degrees, and it is particularly effective when the taper angle α is 10 degrees or less. Further, while the tapered face 18b is usually a plane surface, it may be a curved surface (convex or concave) or a composite of plane surfaces and various curved surfaces. The tip of the distal end portion may not necessarily be pointed but may be rounded or trimmed.

As described above, by reducing the thickness of the distal end portion of each separator, turbulence of gas flow which can occur in the vicinity of the distal end portions of the separators can be controlled, and film uniformity and film reproducibility can be improved. Further, since occurrence of particles attributable to eddy currents can be reduced, crystal defects to be caused by the particles can be reduced to improve film quality and also feedstock utilization efficiency. In addition, since the gas flow velocity setting range in each passage defined by the separators can be increased, gas flow velocities most suitable for thin film deposition can be set, and thus deposition speed can be increased.

FIGS. 5 to 9 show other examples of the distal end portion of the separator respectively.

Figure 5:
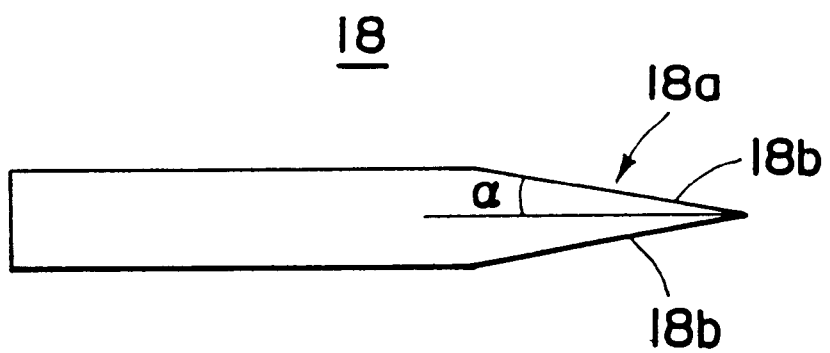
FIG. 5 is a side view showing a second example of the distal end portion of the separator.

The separator 18 shown in FIG. 5 has tapered faces 18b formed on the upper surface and lower surface at the distal end portion 18a, and the taper angle α is preferably set to 5 to 30 degrees, particularly 10 degrees or less, as described above.

Figure 6:
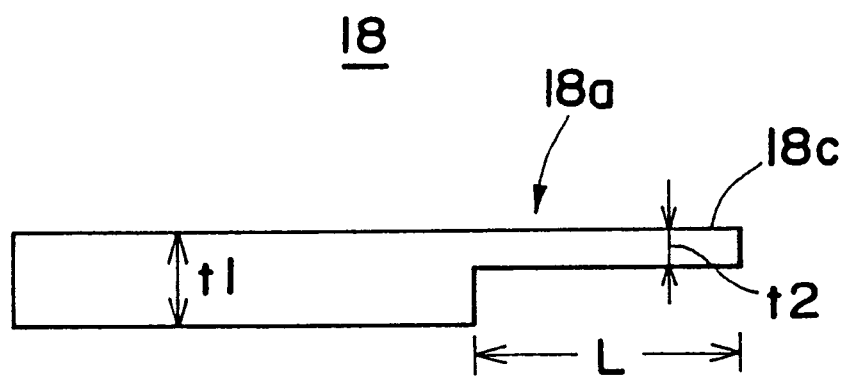
FIG. 6 is side view showing a third example of the distal end portion of the separator.

In the separator 18 shown in FIG. 6, the thickness of the distal end portion 18a is reduced stepwise. The thickness t2 of the distal end portion 18a is sufficiently reduced compared with the thickness t1 of the separator itself, and a thin portion 18c having a sufficient length L is designed to be secured. While the thickness t2 and the length L of the thin portion 18c are decided taking the thickness t1 of the separator itself, gas flow velocity, as well as, rigidity, processability, etc. of the separators into consideration like in the case of the taper angle α, the smaller the thickness t2 and the greater the length L, the more effective. Preferred range of thickness t2 is 0.5 to 1 mm, and preferred range of length L is usually about 10 to 20 mm, while the length L to be secured is desirably relatively great when the difference (t1−t2) is big.

Figure 7:
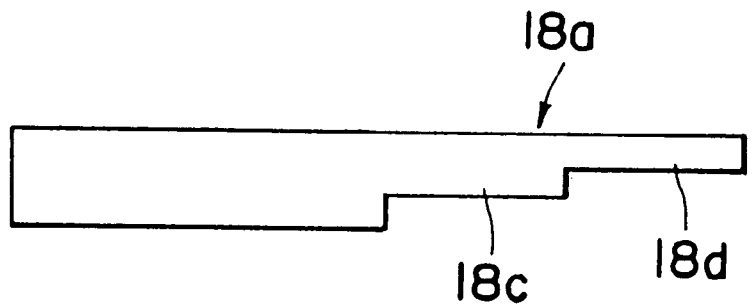
FIG. 7 is a side view showing a fourth example of the distal end portion of the separator.

In the separator 18 shown in FIG. 7, the thickness of the distal end portion 18a is reduced stepwise by forming two thin portions 18c and 18d stepwise. Incidentally, the distal end portion 18a may consist of three or more steps.

Figure 8:
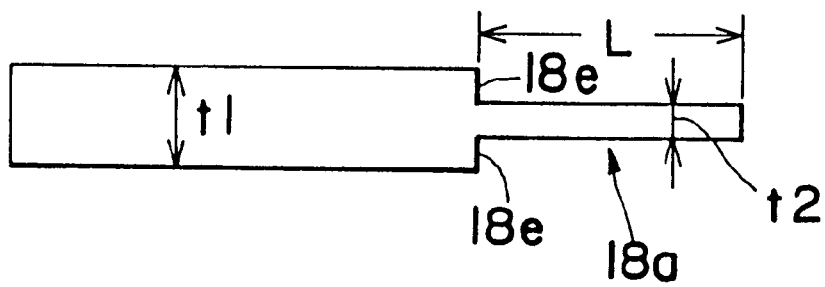
FIG. 8 is a side view showing a fifth example of the distal end portion of the separator.
Figure 9:
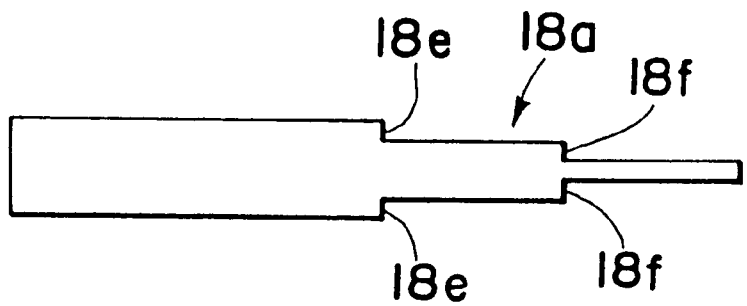
FIG. 9 is a side view showing a sixth example of the distal end portion of the separator.

In the separator 18 shown in FIG. 8, the thickness of the separator 18 is reduced stepwise by forming steps 18e on the upper surface and the lower surface at the distal end portion 18a. In the separator shown in FIG. 9, the thickness of the separator 18 is reduced stepwise by forming steps 18e, 18f on the upper surface and the lower surface at the distal end portion 18a.

When the thickness of the distal end portion 18a is reduced stepwise as described above, each step may have a tapered face, and the tip of the thin portion may be rounded or pointed. Further, the separators shown in FIGS. 4, 6 and 7 may be disposed upside down; and the separators shown in FIGS. 5, 8 and 9 may each have an upper surface and a lower surface formed asymmetrically.

While it is preferred to employ separators 18, 19 of the same configuration, separators of different configurations may be employed in combination.

TEST EXAMPLE 1

A test of forming a GaAs film on a GaAs substrate was carried out using the system having the structure as shown in FIGS. 1 and 2 under the following conditions. A gas formed by diluting arsine as the volatile source gas and silane as a doping gas with hydrogen was introduced to the first passage, while a gas formed by diluting trimethyl gallium (TMG) as the hardly volatile gas with hydrogen was introduced to the second passage, and hydrogen was introduced as the deposition accelerating gas to the third passage. Incidentally, the doping gas had a silane concentration of 10 ppm.

FIG. 3 shows the flow rate balance of the diluent gases when a GaAs film was grown on a 3-inch GaAs substrate vs. film thickness uniformity and Si doping uniformity on the substrate surface. The horizontal axis represents flow rate balance [−] between the diluent gases; the vertical axis represents film thickness uniformity [%] and Si Doping uniformity [%]. Incidentally, the film thickness was determined by means of spectroscopic ellipsometry, whereas the dose of Si doping was determined by measuring carrier concentration by using a profile plotter.

These results show that as the flow rate balance between the diluent gases increases, i.e. as the flow rate of the diluent gas in the first CVD gas in the first passage is increased, the film thickness uniformity is reduced and is increased again at a certain border line. Meanwhile, referring to the conditions for obtaining doping uniformity, it can be understood that they coincide with the optimum conditions of flow rate balance between the diluent gases for obtaining film thickness uniformity. Based on these results, when film formation was carried out under the conditions shown in Table 1, a uniform and excellent GaAs film was obtained.

TABLE 1

|  | First Passage | Second Passage | Third passage |
|---|---|---|---|
| Diluent gas | 8000 sccm | 12000 sccm | 10000 sccm |
| Hydrogen | 0.36 mol/min | 0.54 mol/min | 0.45 mol/min |
| Feedstock gas | 500 sccm | 50 sccm | — |

Incidentally, the flow rate balance between the diluent gases was 8000 sccm/12000 sccm=0.67, wherein sccm stands for "Standard Cubic Centimeter/min".

TEST EXAMPLE 2

Two each of six kinds of separators (t1=1.5 mm) having the configuration shown in FIG. 4 in which the thickness of the distal end portions is reduced continuously or tapered to have taper angles α of 5°, 10°, 20°, 30°, 60° and 90° (with no tapered surface) respectively were employed and were set in reactors, as shown in FIGS. 1 and 2, to define three layers of passages consisting of a first passage, a second passage and a third passage on the upstream part in each reactor. A GaN thin film was deposited, on a sapphire substrate on which AlN is formed beforehand, employing each of the reactors under the following conditions. When the surface of each thin film thus formed was observed using a differential interference microscope, the thin film grown employing the separators having no tapered face had a rough surface due to the presence of portions where particles grew served as nuclei of deposition and had a nonuniform film thickness. However, as the taper angle α became smaller, the surface became flatter. Particularly, the thin films grown using the separators having taper angles α of 20 degrees or less had excellent surface flatness, showing that a great surface condition improving effect was exhibited. GaN thin film deposition speeds and observation results of surface conditions when the respective separators were employed are shown in Table 2.

Deposition Conditions

First passage: ammonia (12 lit/min)
Second passage: trimethyl gallium (40 μmol/min)+hydrogen (6 lit/min)
Third passage; nitrogen (14 lit/min)
Substrate heating temperature: 1050° C.
Deposition pressure: 1 atm
Deposition time: 1 hour

TABLE 2

| Taper angle α [degree] | Deposition speed [μm/hour] | Surface condition |
|---|---|---|
| 5 | 2.4 | Smooth |
| 10 | 2.4 | Smooth |
| 20 | 2.5 | Smooth |

TABLE 2-continued

| Taper angle α [degree] | Deposition speed [μm/hour] | Surface condition |
|---|---|---|
| 30 | 2.3 | Mediocre |
| 60 | 2.1 | Mediocre |
| 90 | 1.3 | Rough |

TEST EXAMPLE 3

Four kinds of separators (t1=1.5 mm, t2=0.5 mm) having the configuration shown in FIG. 6 in which the thickness of the distal end portions is reduced stepwise and also having thin portion lengths L of 0 mm (no thin portion), 5 mm, 10 mm and 20 mm respectively were employed to form three layers of passages in reactors respectively in the same manner as in Example 2. GaN thin films similar to those formed in Example 2 were formed under the following conditions by changing the flow rate of source gas ammonia to 3 lit/min, 5 lit/min, 10 lit/min and 15 lit/min, and the surface of each thin film thus formed was observed by using a differential interference microscope. Observation results of surface condition depending on the thin portion length L and the ammonia flow rate in the respective separators are shown in Table 3.

Deposition Condition first passage: ammonia (3, 5, 10 and 15 lit/min)
second passage: trimethyl gallium (40 μmol/min)+hydrogen (8 lit/min)
third passage; nitrogen (14 lit/min)
substrate heating temperature: 1050° C.
deposition pressure: 1 atm
deposition time: 1 hour

TABLE 3

| Ammonia flow rate [lit/min] | Length [mm] | | | |
|---|---|---|---|---|
| | 0 | 5 | 10 | 20 |
| 3 | Rough | Rough | Mediocre | Smooth |
| 5 | Rough | Mediocre | Smooth | Smooth |
| 10 | Rough | Smooth | Smooth | Smooth |
| 15 | Rough | Mediocre | Smooth | Smooth |

What is claimed is:

1. A chemical vapor deposition system for growing a compound semiconductor thin film of two or more components on the surface of a substrate placed in a reactor by introducing at least two kinds of source gases parallel to the substrate surface, comprising:

two separators disposed in the reactor on the upstream side of a substrate mounting section to be parallel to the substrate surface so as to divide the inside of the reactor into three parallel layers of passages consisting of a first passage, a second passage and a third passage from the substrate mounting section side;

a first chemical vapor deposition gas introducing pipe communicating to the first passage;

a second chemical vapor deposition gas introducing pipe communicating to the second passage; and a deposition accelerating gas introducing pipe communicating to the third passage.

2. The chemical vapor deposition system according to claim 1, wherein the reactor has, at a portion opposing the substrate mounting section, a deposition promoting bed protruding toward the substrate mounting section.

3. The chemical vapor deposition system according to claim 1, wherein the thickness of the separator is reduced continuously at the distal end portion.

4. The chemical vapor deposition system according to claim 1, wherein the thickness of the separator is reduced stepwise at the distal end portion.

5. The chemical vapor deposition system according to claim 1, wherein a first chemical vapor deposition gas formed by diluting a volatile source gas with a diluent gas and a second chemical vapor deposition gas formed by diluting a hardly volatile source gas with a diluent gas are introduced to the first chemical vapor deposition gas introducing pipe and the second chemical vapor deposition gas introducing pipe respectively.

6. The chemical vapor deposition system according to claim 5, wherein a gas containing no source gas and having a diffusion coefficient with respect to the source gases smaller than those of the diluent gases is introduced to the deposition accelerating gas introducing pipe.

7. A chemical vapor deposition process for growing a compound semiconductor thin film of two or more components on the surface of a substrate placed in a reactor by introducing at least two kinds of source gases parallel to the surface of the substrate and effecting a heat reaction of the source gases on the substrate surface to deposit the resulting reaction product thereon, the process comprising:

introducing a first chemical vapor deposition gas formed by diluting a volatile source gas with a diluent gas, a second chemical vapor deposition gas formed by diluting a hardly volatile source gas with a diluent gas and a deposition accelerating gas containing no source gas respectively to a first passage on the substrate mounting section side, a second passage next to it and a third passage farthest from the substrate which are defined on the upstream side of the substrate in the form of three layers parallel to the substrate surface.

8. The chemical vapor deposition process according to claim 7, wherein the deposition accelerating gas is a gas having a diffusion coefficient with respect to the source gases smaller than those of the diluent gases.

9. The chemical vapor deposition process according to claim 8, wherein the ratio of flow rate of the diluent gas in the first chemical vapor deposition gas to that of the diluent gas in the second chemical vapor deposition gas is adjusted without changing the total flow rate of the diluent gases.

* * * * *